United States Patent [19]

Burgyan

[11] Patent Number: 4,524,330

[45] Date of Patent: Jun. 18, 1985

[54] BIPOLAR CIRCUIT FOR AMPLIFYING DIFFERENTIAL SIGNAL

[75] Inventor: Lajos Burgyan, Mt. View, Calif.

[73] Assignee: Signetics Corporation, Sunnyvale, Calif.

[21] Appl. No.: 529,075

[22] Filed: Sep. 1, 1983

[30] Foreign Application Priority Data

Sep. 4, 1982 [JP] Japan ................................. 57-154300

[51] Int. Cl.³ .............................................. H03F 3/45
[52] U.S. Cl. ..................................... 330/257; 330/255
[58] Field of Search ................ 330/257, 255, 288, 307

[56] References Cited

U.S. PATENT DOCUMENTS 3,538,449 11/1970 Solomon .
3,801,923 4/1974 Russell et al. ........................ 330/257
4,147,944 4/1979 Monticelli ........................ 330/257 X
4,228,404 10/1980 Widlar ................................ 330/267

OTHER PUBLICATIONS

Solomon, "The Monolithic Op Amp: A Tutorial Study", *IEEE Journal of Solid-State Circuits*, vol. SC-9, No. 9, pp. 314-331, Dec. 1974.

Widlar, "Low Voltage Techniques", *IEEE Journal of Solid-State Circuits*, vol. SC-13, No. 6, Dec. 1978, pp. 838-846.

Primary Examiner—James B. Mullins
Attorney, Agent, or Firm—R. J. Meetin; R. T. Mayer; T. A. Briody

[57] ABSTRACT

A bipolar differential amplifying circuit contains a pair of input transistors (3 and 4) for receiving a differential input signal, a pair of differentially-configured first and second transistor circuits (5 and 6) coupled to the input transistors, and a subtracting circuit (11 and 12) for comparing the sum of the currents through first collectors ($5C_1$ and $6C_1$) of the transistor circuits with the current through a second collector ($6C_2$) of the second transistor circuit to generate an output signal representative of the input signal. A PN diode (13) is coupled to a second collector ($5C_2$) of the first transistor circuit. The voltages at the collectors are very close, thereby yielding a high common-mode rejection ratio for the input signal.

19 Claims, 1 Drawing Figure

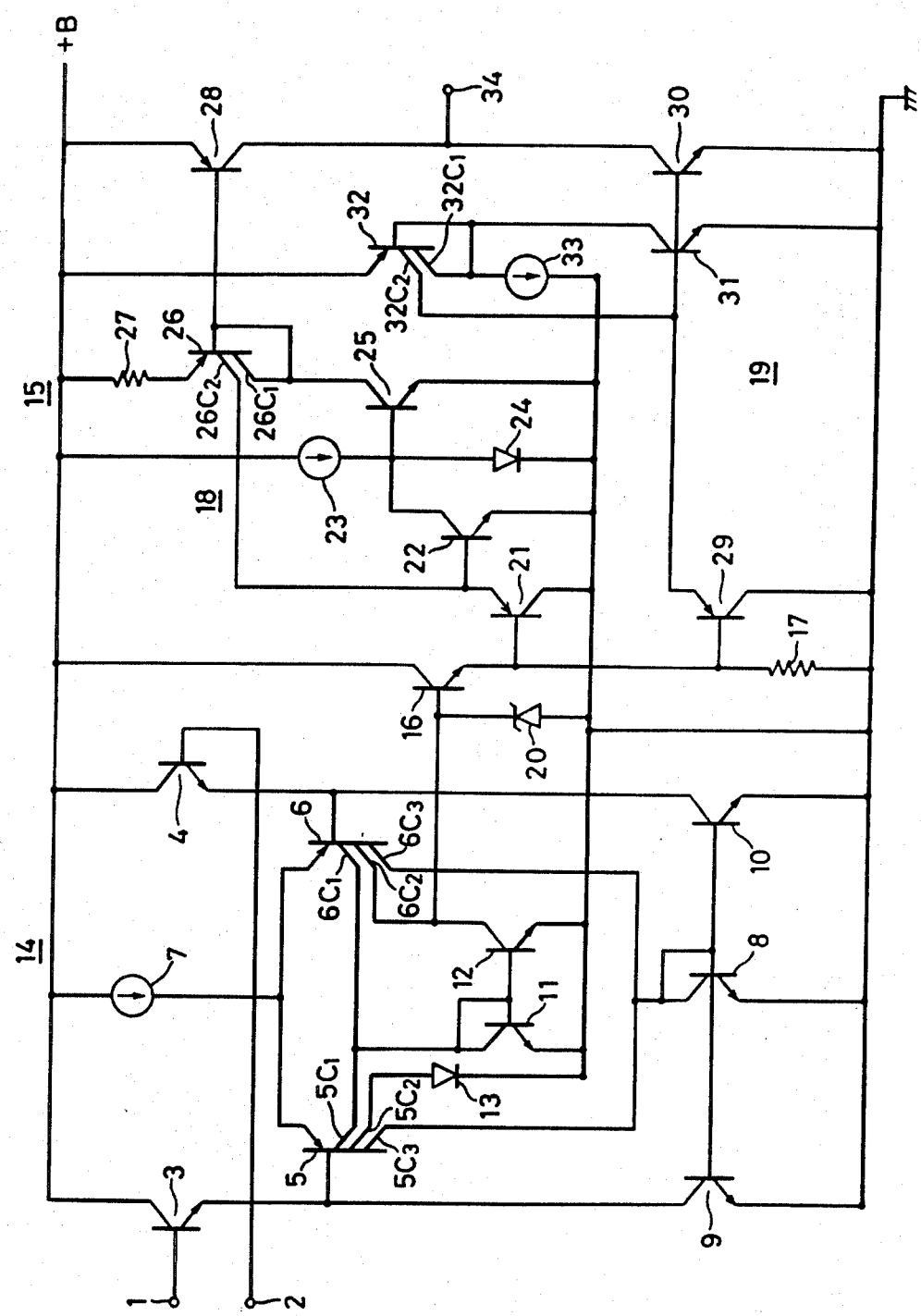

BIPOLAR CIRCUIT FOR AMPLIFYING DIFFERENTIAL SIGNAL

BACKGROUND OF THE INVENTION

1. Field of the Invention

This invention relates generally to bipolar circuits that amplify differential input signals and particularly to such circuits suitable for operational amplifiers utilizing relatively low power supply voltages.

2. Description of the Prior Art

The operational amplifier is an important electronic building block. In the form of an integrated circuit, an operational amplifier usually consists of a differential input stage, a biasing circuit, and an output stage. There are a number of difficulties with conventional bipolar operational amplifiers. Their construction is often relatively complex. They occupy large areas on semiconductor chips and typically require high power supply voltages.

A critical part of an operational amplifier is the differential amplifier that receives the differential input signal to the input stage. One approach in designing the differential amplifier is to utilize a combination of NPN and PNP transistors for amplifying the input signal. For example, see J. Solomon, U.S. Pat. No. 3,538,449, where the use of complementary bipolar transistors allows the differential amplifier to operate at a reduced input current level.

Another design approach is to apply the differential input signal to a pair of multi-collector transistors connected to a current mirror in such a way that the amplified signal current does not pass through the mirror. As described by J. Solomon in "The Monolithic Op Amp: A Tutorial Study," *IEEE J. Solid-State Circs.*, Vol. SC-9, December 1974, pp. 314-332, this approach improves the frequency response. However, current from grounded collectors employed to reduce the transconductance and to provide an acceptable common-mode rejection ratio of the input signal is wasted in this Solomon differential amplifier.

Some bipolar operational amplifiers have been designed so as to be operable at relatively low power supply voltages. R. Widlar discloses an operational amplifier of this type in "Low Voltage Techniques," *IEEE J. Solid-State Circs.*, Vol. SC-13, No. 6, December 1978, pp. 838-846. However, these operational amplifiers are disadvantageous in that their circuitry is generally even more complicated. In addition their bandwidths are limited, and their output signals have undesirable distortions. Because of their size and complexity, they have generally not been satisfactory for use as sub-circuit blocks in large scale integration.

SUMMARY OF THE INVENTION

An object of the present invention is to provide a differential amplifying circuit for an operational amplifier operative at a relatively low power supply voltage. It is a further object of the invention to provide this differential amplifying circuit with a greater bandwidth and common-mode rejection ratio than in the prior art and in an overall structure that is simpler than in the prior art so that the circuit can be conveniently used as a building block in large scale integration.

In accordance with the invention, a differential amplifying circuit suitable for an operational amplifier contains a pair of first-polarity first and second bipolar input transistors, a first transistor circuit, a second transistor circuit, and a subtracting circuit. A differential input signal is supplied to the bases of the input transistors. Each of the transistor circuits contains one or more opposite second-polarity bipolar transistors having one or more bases and one or more emitters. Each base in the first transistor circuit is coupled to an emitter of the first input transistor. Each base in the second transistor circuit is similarly coupled to an emitter of the second input transistor. The emitters of the transistor circuits are all coupled to a first voltage supply. The subtracting circuit suitably compares the sum of the currents flowing through a first collector of the first transistor circuit and a first collector of the second transistor circuit with the current flowing through a second collector of the second transistor circuit to generate a composite output signal representative of the differential input signal.

More particularly, the subtracting circuit contains one or more first-polarity bipolar transistors having one or more bases, one or more emitters, a first collector, and a second collector. Each emitter of the subtracting circuit is coupled to a second voltage supply. Each base of the subtracting circuit is coupled to its first collector which is further coupled to the first collectors of the transistor circuits. The second collector of the subtracting circuit is coupled to the second collector of the second transistor circuit for supplying the composite output signal. The first collectors of the transistor circuits are preferably the same size for transmitting equal, but opposite, signal currents corresponding to the differential input signal. As a result, these signal currents cancel in the first collector of the subtracting circuit. This increases the bandwidth of the invention by removing a pole associated with the subtracting circuit.

Desirably, each base of the subtracting circuit is directly connected to its first collector, and a PN diode is forwardly coupled between the second voltage supply and a second collector of the first transistor circuit. If each transistor in the subtracting circuit is an NPN device, the voltage at the second collector of the first transistor circuit is about $1V_{BE}$ above the second supply voltage. $V_{BE}$ is the standard forward base-to-emitter voltage of an NPN transistor when it is just turned on. Further circuitry which receives the composite output signal is preferably configured in such a manner that the voltage at the second collector of the second transistor circuit varies in a narrow range about $1V_{BE}$ above the second supply voltage. Inasmuch as the first collectors of the transistor circuits are also $1V_{BE}$ above the second supply voltage, the differential amplifying circuit is very closely balanced. Likewise, the circuit of the invention is well balanced when each transistor in the subtracting circuit is a PNP device. Consequently, the invention has a very good common-mode rejection ratio for the input signal.

Current for the input transistors is preferably supplied from a current-source circuit containing one or more first-polarity bipolar transistors having a first collector, a second collector, a third collector, one or more bases coupled to the third collector, and one or more emitters coupled to the second voltage supply. The current-source circuit has its first and second collectors respectively coupled to the emitters of the first and second input transistors, while its third collector is commonly coupled to a third collector of the first transistor circuit and to a third collector of the second transistor circuit.

The third collectors of the transistor circuits are used to reduce the transconductance of the differential amplifying circuit. In contrast to prior art differential amplifiers whose corresponding third collectors are connected directly to the second voltage supply so that there is a waste of current, the present invention avoids this waste by utilizing the current to the third collectors for operating the current-source circuit for the input transistors.

Each base of the current-source circuit is desirably connected directly to its third collector. Consequently, the third collectors of the two transistor circuits are held at approximately the same voltage level as their first and second collectors. This maintains the excellent common-mode rejection ratio of the invention.

The power supply voltage—i.e., the difference between the levels of the first and second voltage supplies—can be as low as 1.5 volts. The invention has a high slew rate. Furthermore, the invention achieves these improvements with greatly reduced size and complexity so as to be readily useable as a component in large scale integration.

BRIEF DESCRIPTION OF THE DRAWING

The sole FIGURE is a circuit diagram of a bipolar operational amplifier having a differential input stage and an output stage according to the invention.

DESCRIPTION OF THE PREFERRED EMBODIMENT

Referring to the drawing, it shows an operational amplifier having a pair of input terminals 1 and 2 that receive a differential input signal. Terminals 1 and 2 are connected to the bases of a pair of identical NPN input transistors 3 and 4 whose emitters are respectively connected to the bases of a pair of identical PNP multi-collector transistors 5 and 6. Transistors 3-6 form a differential amplifier.

Transistors 3 and 4 amplify the differential current between their bases to generate an intermediate amplified differential current at the bases of transistors 5 and 6. The amplification factor of transistors 3 and 4 is relatively large so that they can operate with extremely small base currents. Transistors 5 and 6 further amplify the intermediate differential current.

A main constant current source 7 is connected between the emitters of transistors 5 and 6 and a power supply +B. Since transistors 5 and 6 are identical, their emitters have equal areas. Transistors 5 and 6 have respective first collectors $5C_1$ and $6C_1$ connected together at a common junction, respective second collectors $5C_2$ and $6C_2$, and respective third collectors $5C_3$ and $6C_3$ connected together at another common junction. Collectors $5C_1$ and $6C_1$ are the same size. Collectors $5C_2$ and $6C_2$ are the same size which is twice that of collectors $5C_1$ and $6C_1$. Collectors $5C_3$ and $6C_3$ serve to reduce the transconductance of the differential amplifier. They likewise are the same size, the value of which depends on how much the transconductance is to be reduced.

The current for transistors 3 and 4 is supplied from a current-source circuit consisting of an NPN transistor 8 and a pair of identical NPN transistors 9 and 10 arranged as current mirrors with transistor 8. The bases of transistors 8-10 are connected together and to the collector of transistor 8. Its collector is further connected to the common junction between collectors $5C_3$ and $6C_3$. This connection provides the bias voltage/current for transistors 9 and 10 and thereby avoids a waste of current that would otherwise occur if collectors $5C_3$ and $6C_3$ were connected directly to ground reference (0 volt).

The collectors of transistors 9 and 10 are respectively connected to the emitters of transistors 3 and 4. The emitters of transistors 8-10 are connected together and to ground reference. The ratio of the emitter area of transistor 9 or 10 to that of transistor 8 is set according to the requirements of the specific application. Nevertheless, the currents through transistors 9 and 10 are determined by the current through transistor 8 and, consequently, by the current through current source 7. A change in the current through collector $5C_3$ is balanced by an equal, but opposite, change in current through collector $6C_3$. The current through transistor 8 is thus constant so that transistors 9 and 10 act respectively as input constant current sources for transistors 3 and 4.

A subtracting circuit consisting of identical NPN transistors 11 and 12 arranged as a current mirror generates a composite amplified output current representative of the input signal by subtracting the current flowing through collector $6C_2$ from the sum of the currents flowing through collectors $5C_1$ and $6C_1$. The bases of transistors 11 and 12 are connected together and to the collector of transistor 11. Its collector is further connected to the common junction between collectors $5C_1$ and $6C_1$. The collector of transistor 12 is connected to collector $6C_2$ to provide the composite output current. The emitters of transistors 11 and 12 are connected together and to ground.

When the differential input signal changes value (e.g., from zero to a non-zero value), the change in current through collector $5C_1$ is balanced by an equal, but opposite, change in current through collector $6C_1$. Thus, the current through transistor 11 does not vary as the differential portion of the input signal varies. This eliminates a pole in the subtracting circuit so as to improve its high-frequency characteristics.

Neglecting the small base currents to transistors 11 and 12, the current through transistor 11 is duplicated in transistor 12. Inasmuch as the size of collector $6C_2$ is equal to the combined size of collectors $5C_1$ and $6C_1$, the output current from the junction between collector $6C_2$ and the collector of transistor 12 equals the current differential between transistors 5 and 6 multiplied by the ratio of the size of collector $6C_1$ (or $5C_1$) to the total collector size of transistor 6 (or 5). The composite output current is in phase with the input signal—i.e., the output current increases when the voltage between terminals 1 and 2 increases, and vice versa.

Collector $5C_2$ transmits a quiescent current equal to the quiescent current through collector $6C_2$ so as to keep the differential amplifier in balance. Collector $5C_2$ is connected to the anode of a PN diode 13 whose cathode is connected to ground reference. Diode 13 is preferably an NPN transistor whose base and collector are connected together.

As described below, the circuitry which receives the output current from the junction between collector $6C_2$ and the collector of transistor 12 is arranged in such a manner that the voltage at collector $6C_2$ varies in a small range about $1V_{BE}$ above ground. A $V_{BE}$ is about 0.6-0.7 volt. Because of the use of diode 13, the voltage at collector $5C_2$ is held about $1V_{BE}$ above ground. The connections of transistors 8 and 11 as diodes likewise cause collectors $5C_1$, $6C_1$, $5C_3$, and $6C_3$ to reside about $1V_{BE}$ above ground. Consequently, transistors 5 and 6 are fully balanced with respect to each other. This provides a very high common-mode rejection ratio.

The foregoing elements of the operational amplifier form an input stage 14 consisting of an input portion and an output portion. The input portion is the differential amplifier consisting of transistors 3–6 in combination with the current-source circuit consisting of transistors 8–10. The common-mode portion of the input signal that can be processed by the input portion ranges between $1V_{BE}$ and the voltage of power supply +B. The foregoing arrangement of transistors 5 and 6 enables the differential amplifier to have a very stable DC operational point. Transistors 5 and 6 also provide a relatively high slew rate because current source 7 supplies a relatively large current. The output portion of input stage 14 is the current-mirror subtracting circuit consisting of transistors 11 and 12 in combination with collector $6C_2$.

The output portion of input stage 14 is connected to an output stage 15 consisting of a further NPN transistor 16, a resistor 17, a first current amplifier 18, and a second current amplifier 19. The current output from input stage 14 is supplied to the base of transistor 16 whose collector is tied to power supply +B. The emitter of transistor 16 is coupled through resistor 17 to ground reference and supplies a further voltage signal in phase with the current output from stage 14. That is, the combination of transistor 16 and resistor 17 enables the current output at the base of transistor 16 to be converted into a voltage at its emitter.

A Zener diode 20 is connected between ground and the base of transistor 16. Diode 20 prevents damage to current amplifiers 18 and 19 when supply +B is being turned on or off. Should the voltage at the base of transistor 16 rise up to the breakdown voltage of diode 20, it breaks down to create a path to ground so as to prevent the voltage at the base of transistor 16 from rising much further.

Current amplifier 18 has a first voltage-to-current converter for converting the voltage at the emitter of transistor 16 into a corresponding first intermediate current. In this voltage-to-current converter, a PNP transistor 21 has its base connected to the emitter of transistor 16 and its emitter connected to the base of an NPN transistor 22 whose collector is coupled through a constant current source 23 to supply +B. The collector of transistor 21 and the emitter of transistor 22 are both tied to ground. In addition, the collector of transistor 22 is coupled through a PN diode 24 to ground and to the base of an NPN transistor 25 whose emitter is tied to ground. Diode 24 is preferably an NPN transistor having its base and collector connected together. The amplified current through transistor 25 is the intermediate current of the voltage-to-current converter. Because current source 23 provides a constant current, the current through transistor 25 increases when the current through transistor 22 is reduced, and vice versa. That is, the current through transistor 25 is of opposite phase to the current through transistor 22.

A PNP multi-collector transistor 26 in the voltage-to-current converter has a first collector $26C_1$ connected to the collector of transistor 25 and a second collector $26C_2$ connected to the emitter of transistor 21 and the base of transistor 22. Transistor 26 has its base connected to collector $26C_1$ and its emitter coupled through a resistor 27 to supply +B. Neglecting small base currents, the current through transistor 25 equals the current through collector $26C_1$.

Current amplifier 18 further contains a PNP output transistor 28 responsive to a voltage corresponding to the intermediate current from the first voltage-to-current converter. Transistor 28 has its emitter tied to supply +B and its base connected to the base of transistor 26 in a current amplifier configuraton. The current through transistor 28 equals the current through collector $26C_1$ multiplied by an amplification factor dependent on the value of resistor 27 and the ratio of the emitter area of transistor 28 to that of transistor 26.

Current amplifier 19 has a second voltage-to-current converter for converting the voltage at the emitter of transistor 16 into a corresponding second intermediate current. In the second voltage-to-current converter, a PNP transistor 29 has its base connected to the emitter of transistor 16. Transistor 29 has its collector tied to ground and its emitter connected to the bases of NPN transistors 30 and 31 whose emitters are grounded. The amplified current through transistor 31 is the intermediate current of the second voltage-to-current converter.

The collector of transistor 31 is connected to the base of a PNP multi-collector transistor 32 whose emitter is tied to supply +B. A first collector $32C_1$ of transistor 32 is connected back to its base and is coupled through a constant current source 33 to ground. A second collector $32C_2$ of transistor 32 is connected to the emitter of transistor 29 and the base of transistor 31. Neglecting the small base current for transistor 32, the current through collector $32C_1$ equals the sum of the currents through current source 33 and transistor 31. Since the current provided by current source 33 is constant, the current through collector $32C_1$ is in phase with the current through transistor 31. As a result, the current through collector $32C_2$ is in phase with the current through transistor 31.

Transistor 30 is an output transistor for current amplifier 19. By virtue of the interconnection of the bases of transistors 30 and 31, transistor 30 is responsive to a voltage corresponding to the intermediate current from the second voltage-to-current converter. The current through transistor 30 equals the current through transistor 31 multiplied by the ratio of the emitter area of transistor 30 to that of transistor 31.

Current amplifiers 18 and 19 provide amplified output currents of opposite phase from respective transistors 28 and 30. Their collectors are connected together at a common junction from which an output terminal 34 provides a circuit output current equal to the difference between the output currents through transistors 28 and 30.

Output stage 15 operates as follows. The voltage at the emitter of transistor 16 is in phase with its base current supplied as the output from input stage 14.

In current amplifier 18, transistor 21 couples the voltage at the emitter of transistor 16 to transistor 22 to cause its current to vary in phase with this voltage. The amplified current through transistor 25 is then of opposite phase to this voltage. The current through transistor 25 flows through collector $26C_1$ and resistor 27 and is mirrored in transistor 28 with a specified gain. Consequently, the output current through transistor 28 is of opposite phase to the voltage at the emitter of transistor 16.

The current through second collector $26C_2$ is in phase with the current through transistor 25 and is therefore of opposite phase to the current through transistor 22. This establishes a negative feedback loop that causes current amplifiers 18 and 19 to have approximately equal gains.

In current amplifier 19, transistor 29 couples the voltage at the emitter of 16 to transistor 31 to cause its amplified current to vary in phase with this voltage. As a result, the output current through transistor 30 is in phase with this voltage.

The current through collector $32C_2$ is in phase with the current through transistor 31 since the current through collector $32C_1$ is in phase with the current through transistor 31. This provides a controlled positive feedback loop that boosts the output current capability of transistor 30 without compromising the operating point stability.

Briefly turning to the interface between stages 14 and 15, the voltage at the base of each of transistors 22 and 31 is close to $1V_{BE}$ above ground. The emitter-to-base voltage of each of transistors 21 and 29 is likewise close to $1V_{BE}$. The voltage across resistor 17 is thus quite small, typically on the order of 40 millivolts. The variation in the emitter voltage of transistor 16 is also quite small, typically several millivolts. As a result, the voltage at collector $6C_2$ is just slightly above $1V_{BE}$ more than ground. Since collectors $5C_1$–$5C_3$, $6C_1$, and $6C_3$ are $1V_{BE}$ above ground, the differential amplifier in input stage 14 is balanced virtually as well as possible.

Although the voltage supplies were described above as supply +B and ground reference, this was done only for the purpose of facilitating the explanation. More generally, various combinations of positive and/or negative power supplies or a combination of ground reference and a negative power supply may provide the supply voltages.

In a preferred embodiment, power supply +B is about 8 volts maximum. Current source 7 is about 50 microamperes. Each collector $5C_3$ or $6C_3$ is the same size as collector $5C_1$ or $6C_1$. The ratio of the emitter area of transistor 9 or 10 to the emitter area of transistor 8 is about 1.5. Zener diode 20 has a breakdown voltage of about 6 volts. Transistors 21 and 29 which are protected by diode 20 have breakdown voltages of 6–8 volts. Resistor 17 is 4,000 ohms. Current source 23 is 50–100 microamperes. Current source 33 is 20 microamperes. Resistor 27 is 2,000 ohms. Collector $26C_1$ is five times the size of collector $26C_2$. Transistor 28 has nine times the emitter area of transistor 26. Collectors $32C_1$ and $32C_2$ are the same size. Transistor 30 has twice the emitter area of transistor 31.

A capacitor (not shown) is connected between the base of transistor 16 and terminal 34 to provide stability. This capacitor is preferably 25 picofarads.

The present operational amPlifier is preferably fabricated as a monolithic integrated circuit according to conventional planar processing techniques. PN junction isolation is typically used to separate active device regions on a semiconductor wafer.

The present operational amplifier can operate at a relatively low power supply voltage. Because the arrangement of this operational amplifier is relatively simple, it is particularly suitable for use as a component in large scale integration. Moreover, the operational amplifier operates efficiently across a wide frequency band with a relatively high slew rate and a low input current level.

While the invention has been described with reference to particular embodiments, this description is solely for the purpose of illustration and is not to be construed as limiting the scope of the invention claimed below. For example, semiconductor elements of opposite polarity to those described above may be employed to accomplish the same results. Each of the multi-collector transistors may be replaced with a (multiple-transistor) current mirror, and vice versa. Thus, various modifications, changes, and applications may be made by those skilled in the art without departing from the true scope and spirit of the invention as defined by the appended claims.

What is claimed is:

1. A circuit comprising:
   first and second first-polarity bipolar input transistors having respective bases for receiving a differential input signal;
   first and second transistor means each comprising at least one second-polarity bipolar transistor having at least one emitter, at least one base, a first collector, and a second collector, the second polarity being opposite to the first polarity, the emitters coupled to a first voltage supply, each base of the first means coupled to an emitter of the first transistor, each base of the second means coupled to an emitter of the second transistor, and the first collectors coupled together;
   a PN diode forwardly coupled between the second collector of the first means and a second voltage supply; and
   subtracting means comprising at least one first-polarity bipolar transistor having a first collector coupled to the first collectors of the transistor means, at least one base each coupled to the first collector of the subtracting means, at least one emitter each coupled to the second supply, and a second collector coupled to the second collector of the second means for supplying a composite output signal representative of the input signal.

2. A circuit as in claim 1 further including a main current source coupled between the first supply and the emitters of the transistor means separate from collectors of the input transistors.

3. A circuit as in claim 2 further including current-source means comprising at least one first-polarity bipolar transistor having a first collector coupled to the emitter of the first transistor, a second collector coupled to the emitter of the second transistor, a third collector commonly coupled to another collector of the first means and to another collector of the second means, at least one base each coupled to the third collector, and at least one emitter each coupled to the second voltage supply.

4. A circuit as in claim 3 further including:
   a first current amplifier for supplying an output terminal with a first output current signal of substantially the opposite phase to the output signal; and
   a second current amplifier for supplying the output terminal with a second output current signal substantially in phase with the output signal such that the output terminal provides a circuit output current equal to the difference between the current levels of the current signals.

5. A circuit as in claim 1 wherein each base of the subtracting means is directly connected to its first collector.

6. A circuit as in claim 5 further including:
   a pair of first and second input current sources respectively coupled to the emitters of the first and second transistors; and a main current source coupled between the first supply and the emitters of the transistor means.

7. A circuit as in claim 5 wherein the transistor means are substantially identical, their first collectors being substantially the same size and their second collectors being substantially twice the size of their first collectors.

8. A circuit as in claim 5 further including a main current source coupled between the first supply and the emitters of the transistor means.

9. A circuit as in claim 8 wherein said at least one transistor of each transistor means is a multi-collector transistor whose collectors comprise the first and second collectors of that transistor means.

10. A circuit as in claim 9 wherein said at least one transistor in the subtracting means is a pair of transistors, each having a base, an emitter, and a collector, both having their bases connected together, both having their emitters connected together, the collector of one connected to their bases and being the first collector of the subtracting means, and the collector of the other being the second collector of the subtracting means.

11. A circuit as in claim 5 furthr including current-source means comprising at least one first-polarity bipolar transistor having a first collector coupled to the emitter of the first transistor, a second collector coupled to the emitter of the second transistor, a third collector commonly coupled to a third collector of the first means and to a third collector of the second means, at least one base each coupled to the third collector of the current-source means, and at least one emitter each coupled to the second supply.

12. A circuit as in claim 11 wherein the transistor means are substantially identical, their first collectors being substantially the same size, their second collectors being substantially twice the size of their first collectors, and their third collectors being substantially the same size.

13. A circuit as in claim 11 wherein said at least one transistor in the current-source means is three transistors, each having a base, an emitter, and a collector, all three having their bases connected together, the collector of one being the first collector of the current-source means, the collector of another being the second collector of the current-source means, and the collector of the last connected to their bases and being the third collector of the current-source means.

14. A circuit as in claim 11 further including a main current source coupled between the first supply and the emitters of the transistor means.

15. A circuit as in claim 11 further including:
a first-polarity further transistor having a base coupled to the second collectors of the second and subtracting means, an emitter for providing a further signal substantially in phase with the composite output signal, and a collector coupled to the first supply; and
an impedance element coupled between the second supply and the emitter of the further transistor.

16. A circuit as in claim 15 further including a Zener diode coupled between the second supply and the base of the further transistor.

17. A circuit as in claim 16 further including;
a first current amplifier for supplying an output terminal with a first output current signal of substantially opposite phase to the composite output signal; and
a second current amplifier for supplying the output terminal with a second output current signal substantially in phase with the composite output signal such that the output terminal provides a circuit output current equal to the difference between the current levels of the current signals.

18. A circuit as in claim 17 wherein:
the first current amplifier comprises (1) a first voltage-to-current converter for generating a first intermediate current of substantially opposite phase to the further signal and (2) a first output device connected to the output terminal for supplying the first output current signal in response to a voltage corresponding to the first intermediate current; and
the second current amplifier comprises (1) a second voltage-to-current converter for generating a second intermediate current substantially in phase with the further signal and (2) a second output device connected to the output terminal for supplying the second output current signal in response to a voltage corresponding to the second intermediate current.

19. A circuit as in claim 18 wherein each voltage-to-current converter comprises (1) a second-polarity third bipolar transistor having a base for receiving the further signal and having a collector coupled to the second supply and (2) a first-polarity fourth bipolar transistor having a base coupled to an emitter of the third transistor and having an emitter coupled to the second supply.

* * * * *